United States Patent [19]
Bottomley et al.

[11] Patent Number: 5,411,837
[45] Date of Patent: May 2, 1995

[54] WATERBORNE PHOTORESISTS HAVING BINDERS WITH SULFONIC ACID FUNCTIONALITY

[75] Inventors: Stephen E. Bottomley, Brea; Daniel E. Lundy, Pamona; Betsy Dadah, Irvine; Robert K. Barr, Laguna Niguel, all of Calif.

[73] Assignee: Morton International, Inc., Chicago, Ill.

[21] Appl. No.: 241,872

[22] Filed: May 12, 1994

Related U.S. Application Data

[63] Continuation-in-part of Ser. No. 199,037, Feb. 18, 1994, Pat. No. 5,364,737, which is a continuation-in-part of Ser. No. 186,875, Jan. 25, 1994, abandoned.

[51] Int. Cl.[6] ................................. G03C 1/73
[52] U.S. Cl. ............................. 430/281; 430/906; 430/910; 522/85; 522/110
[58] Field of Search ............ 430/281, 906, 910; 522/85, 110

[56] References Cited

U.S. PATENT DOCUMENTS

| | | | |
|---|---|---|---|
| 3,929,743 | 12/1975 | Sramek | 260/80.8 |
| 4,079,028 | 3/1978 | Emmons et al. | 260/29.6 |
| 4,426,485 | 1/1984 | Hoy et al. | 524/591 |
| 4,743,698 | 5/1988 | Ruffner et al. | 549/478 |
| 4,952,481 | 8/1990 | Seio et al. | 430/284 |
| 5,045,435 | 9/1991 | Adams et al. | 430/288 |

FOREIGN PATENT DOCUMENTS 0362769  4/1990  European Pat. Off.

*Primary Examiner*—Jack P. Brammer
*Attorney, Agent, or Firm*—Wayne E. Nacker; Gerald K. White

[57] ABSTRACT

A waterborne photoimageable composition or photoresist comprises a latex binder polymer having acid acid functionality to render it developable in alkaline aqueous solution, at least about 50 mole percent of the acid functionality being sulfonic acid moieties, a photopolymerizeable monomer fraction, and a photoinitiator chemical system.

3 Claims, No Drawings

WATERBORNE PHOTORESISTS HAVING BINDERS WITH SULFONIC ACID FUNCTIONALITY

This is a continuation-in-part of application Ser. No. 08/199,037, filed on Feb. 18, 1994, now U.S. Pat. No. 5,364,737, which is a continuation-in-part of Ser. No. 186,875 filed Jan. 25, 1994, now abandoned.

The present invention is directed to photoresists, such as those used for forming printed circuit boards and more particularly to waterborne photoresists.

BACKGROUND OF THE INVENTION

Photoimageable compositions useful as resists for forming printed circuits, printing plates, solder masks or the like have been used for some time now. The earliest photoresists were solvent-borne and solvent-developable. The development of aqueous-developable resists represented an advance in reducing solvent emissions in the immediate workplace and in the general environment. The continued emphasis in reducing organic solvent both from the workplace and from the general environment has spurred the search for waterborne photoresists which are formulated and applied as aqueous liquids.

U.S. Pat. No. 5,045,435, the teachings of which are incorporated herein by reference, describes a waterborne photoresist composition which is developable in alkaline aqueous solution. The composition comprises a multifunctional monomer, a photoinitiator and a latex of water-insoluble carboxylated acrylic copolymer. To stabilize the composition and to adjust the viscosity, this patent teaches neutralizing the latex polymer to at least 25% with a base, such as ammonia, another amine, or sodium hydroxide.

Waterborne, emulsion photoresists, heretofore have had relatively low solids levels. This has resulted in dry times longer than might be desired. It is therefore a general object of the present invention to provide waterborne photoresists having higher solids levels.

SUMMARY OF THE INVENTION

In accordance with the invention, a waterborne photoimageable composition comprises an aqueous composition containing A) between about 30 and about 80 wt % of a latex binder polymer having acid functionality, at least about 50 mole percent of which is sulfonic acid functionality, the acid functionality providing, in total, an acid number of between about 40 and about 250, B) between about 15 and about 50 wt % of alpha,beta-ethylenically unsaturated monomer(s), C) between about 0.1 and about 25 wt % of a photoinitiator or photoinitiator chemical system which generates free radicals, and D) between about 1 and about 40 wt % of a neutralizing base and/or polyether polyurethane associate thickener in amounts sufficient to stabilize the photoimageable composition as an aqueous emulsion, the weight percentages being based on total weight of components A-D.

DETAILED DESCRIPTION OF CERTAIN PREFERRED EMBODIMENTS

Latex binder polymers useful in the photoimageable composition of the present invention are typically prepared by emulsion polymerization of alpha, beta-unsaturated monomers. Sufficient acid functional monomers are used to provide the acid number of between about 40 and about 250, preferably at least about 80. A typical emulsion polymerization procedure and some examples of suitable emulsions are found in U.S. Pat. No. 3,929,743, the teachings of which are incorporated herein by reference.

The binder polymers used in accordance with the invention are formed, at least in part, from alpha, beta-unsaturated monomers having sulfonic moieties. Suitable sulfonic monomers have the general formula: $H_2C=CHA-CO-B-X-Y-SO_3H$, where $A=H$, $CH_3$; $B=O, S, N-Z$; $Z=A$, aliphatic linear or branched $C_2-C_8$ alkyl, $C_6-C_{12}$ cyclic or bicyclic alkyl, phenyl, methyl phenyl, ethyl phenyl, propyl phenyl, butyl phenyl, naphthyl, $C_1-C_4$ mono or disubstituted naphthyl; $X=C_2-C_{10}$ linear, branched, cyclic, or bicyclic alkanes, $(C_mH_{2m}O)n$ where m is 2–4 and n is 1–20, methyl phenyl, ethyl phenyl, propyl phenyl, butyl phenyl, naphthyl, $C_1-C_4$ mono or disubstituted naphthyl; and $Y=O$, but nothing when X is $(C_mH_{2m}O)_n$.

Preferred sulfonic acid functional monomers have the formulae: $CH_2=CR^1-COO-R^2-O-SO_3H$ and $CH_2=CR^1-CONH-R^2-O-SO_3H$ where $R^1$ is H or $CH_3$ and $R^2$ is $C_1-C_6$ alkylene. Particularly suitable sulfonic acid functional monomers are 2-acrylamido, 2-methylpropane sulfonic acid ($CH_2=CH-CO-NH-CH_2-CH(CH_3)-O-SO_3H$) and 2-propenoic acid, 2-methyl-2-sulfoethyl ester (2-sulfoethyl methacrylate) ($CH_2=C(CH_3)-COO-C_2H_4-O-SO_3H$). At least about 50 mole percent of the acid functionality up to 100 percent of the acid functionality of the binder is sulfonic acid functionality. The remaining acid functionality may be provided by monomers having the general formulae: $CH_2=CR^1-COOH$, $CH_2=CR^1-COO-R^2-OOC-R^3-COOH$, $CH_2=CR^1-COO-R^2-O-PO_3H_2$, $CH_2=CR^1-CONH-R^2-O-PO_3H_2$, and $CH_2=CR^1-CONH-(R^4)_q-COOH$, wherein $R^1$ is H or Me, $R^2$ is $(CH_2)_n$ with n being 1 to 6, $R^3$ is an alkylene group of 1 to 6 carbon atoms or a phenylene group, the $R^4$s are the same or different and are selected from $CH_2$ and CHOH, and q=1 to 6.

Some specific examples of suitable acid functional monomers are acrylic acid, methacrylic acid, maleic acid, fumaric acid, citraconic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer. The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

To help ensure that the photoimageable composition is contact imageable, i.e., drys to a tack-free state, the glass transition temperature ($T_g$) of the latex binder polymer is preferably at least about 60° C. as measured by Differential Scanning Calorimetry (DSC) @ 20° C./min. The polymers have a Weight average molecular weight (Mw) of between about 500 and about 200,000 as measured by gel permeation chromatography (GPS) using a polystyrene standard.

The use of binder polymers having sulfonic acid functionality enables stable emulsions to be produced having lower acid numbers then if corresponding polymers were used having only carboxylic acid functionality. As noted before, using binders having sulfonic acid functionality, higher solid levels, e.g., up to about 70 wt. % may be achieved, thereby reducing drying time. Higher solids also improve coatability. It is further believed that the sulfonic acid functional binders improve adhesion and chemical resistance of the imaged photoimageable composition.

To produce the image, this negative-acting photoimageable composition contains photopolymerizeable monomers, particularly alpha,beta-ethylenically unsaturated monomers, including a substantial portion of multi-functional monomers. Useful monomers include those, listed above, used to form the binder polymers. Particularly suitable monomers include multifunctional acrylic monomers, such as tetraethylene glycol diacrylate (TEGDA), trimethylol propane triacrylate (TMPTA), butanediol dimethacrylate (BDDMA) and pentaerythritol triacrylate (PETA). The monomer fraction may include both water-soluble and water-insoluble monomers; however, the monomer fraction should contain a sufficiently high proportion of water-insoluble monomers(having solubilities in water at 20° C. below about 0.3 g/100 ml), e.g., above about 20 mole percent, so that the monomer fraction, as a whole, is insoluble in water.

To initiate polymerization of the monomers upon exposure to actinic radiation, the photoimageable composition contains an appropriate photoinitiator(s) or photoinitiator chemical system. Suitable photoinitiators include benzoin ethers, benzil ketals, acetophenones, benzophenones and related compounds with amines. preferred initiators are thioxanthones, e.g., 2-isopropyl thioxanthones, particularly in conjunction with an amine.

Preferably, the waterborne photoimageable compositions include a poly(siloxane) selected from the group consisting of cyclo poly(dimethylsiloxanes), polyether modified poly(dimethylsiloxanes), poly(dimethylsiloxanes) and mixtures thereof, cyclo poly(dimethylsiloxanes) and polyether modified poly(dimethylsiloxanes) being preferred. The poly(siloxane)(s) are used at a level of between about 0.1 and about 10 wt % relative to components A)-D). Most preferably, the poly(siloxane) fraction is a mixture of cyclo poly(dimethylsiloxanes) and polyether modified poly(dimethylsiloxanes) at a weight ratio of between about 1:9 and about 9:1. An example of such a mixture is Dow Corning Q4-3667 which is an 80:20 mixture of polyether modified poly(dimethylsiloxanes) and cyclo poly(dimethylsiloxanes). The poly(siloxanes) help to provide a tack-free surface, desirable for contact printing.

Useful poly(dimethylsiloxanes) have the general formula $(CH_3)_3$—$[Si(Me)_2$—$O]_n$—$Si(CH_3)_3$ where n is 0–4,000.

Cyclo poly(dimethylsiloxanes) have the general formula —$[Si(Me_2)$—$O]_n$— where n is 3 to 60.

Polyether Modified poly(dimethylsiloxanes) have the general formula:

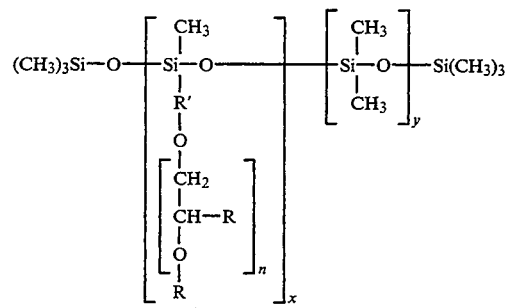

where n=0 to 1500, x=1 to 2,000, y=1 to 2000, R=H or $CH_3$ R'=$(CH_2)_{0-5}$ and the groups subscripted x and y are in random order.

Molecular weights of the poly(siloxanes) may vary over a very broad range. Low molecular poly(siloxanes) may have weight average molecular weights in the 100–600 Mw range; high molecular poly(siloxanes) may have weight average molecular weights in the 2,000 to 500,000 Mw range.

The waterborne photoimageable composition preferably includes a surfactant which is a fluoroaliphatic oxyethylene adduct at a level of between about 0.5 and about 3.0 wt % based upon the combined weights of components A)-D) above. Such surfactants have the general formula:

$CF_3$—$(CF_2)_n$—Y—$X_m$—Z; where n=0 to 20, Y=-$SO_2$—$N(C_1-C_{10}alkyl)$, X=$CH_2$—$CH_2$—O or $CH(CH_3)$ —$CH_2$—O, m=0 to 20, and Z=$CH_2$—$CH_2$—OH or $CH(CH_3)$—$CH_2$—OH.

Stabilization of the emulsion, including binder polymer is required. Emulsion stabilization and may be accomplished by at least partial neutralization with a base, as is taught in above-referenced U.S. Pat. No. 5,045,435. Preferably, as is taught in U.S. patent application No. 08/199,037, of which this application is a continuation-in-part, stabilization of the emulsion and viscosity adjustment are achieved using a polyether polyurethane associate thickener. Polyether polyurethane thickeners are polymers having at least two hydrophobic segments which are the residues of hydrophobic isocyanates, generally isocyanates having isocyanate functionality of 2 or higher, and at least one hydrophilic polyether segment joining the hydrophobic segments by urethane linkages. The block polymers which act as associate thickener may take a variety of forms including ABA, $(AB)_n$, star polymers and the like. The polyether segments are formed from poly(alkylene oxide) segments, formed from monomers such as propylene oxide and ethylene oxide. To be sufficiently hydrophilic, generally it is necessary that at least about 3 mole percent of the poly(alkylene oxide) segment(s) be ethylene oxide residues. The hydrophobic portion of the isocyanate residue is typically an alkyl, cycloalkyl or aromatic moiety. Polyether polyurethane associate thickeners and their function are described, for example by A. J. M. Knoef, and H. Slingerland, "Urethane-Based Polymeric Thickeners for Aqueous Coating Systems" *JOCCA*, Sept. 1992, pp 335–338; J. H. Bieleman et al. *Polymers Paint Colour Journal* 1986, V.176(4169) pp. 450–460; and A. J. Whitton and R. E. Van Doren *Polymers Paint Colour Journal* 1991, V.181(4286) pp. 374–377. Particularly suitable polyether polyurethane associate thickeners and their synthesis are described in U.S. Pat. No. 4,079,028 to Emmons et al., the teachings of which are incorporated herein by reference. Suitable polyether polyurethane associate thickeners are also described in U.S. Pat. Nos. 4,426,485 to Hoy et al. and 4,743,698 to Ruffner et al., the teaching of each of which are incorporated herein by reference. Examples of suitable commercially available associate thickeners are DSX1514 (Henkel) and QR708 (Rohm and Haas).

By using the polyether polyurethane associate thickener, less neutralization of the binder polymer latex is required. In some cases no neutralization is required. In other cases, it is desirable to neutralize the binder up to about 20% of the equivalent acid functionality of the binder polymer. Typically base will be added to neutralize at least about 2% of the acid functionality of the binder polymer. Neutralization may be done with ammonia; primary, secondary, or tertiary amines; or hydroxides. Preferred neutralizing bases are hydroxy functional tertiary amines. The addition of associate thickener in place of at least some of the neutralizer allows for a smoother more uniform coating. The improved coating quality minimizes potential circuit board defects caused by thin spots or pin holes in the coating. In addition, when applied by roller coating, the photoimageable composition with associate thickener produces a smoother coating at lower roller compression. Low roller compression results in extended life of the rubber rollers.

Reducing neutralizers improves chemical resistance of the applied and dried photoimageable composition layer. When ammonia or amine use is reduced, odor is reduced. Associate thickeners reduce viscosity drift of the aqueous photoimageable composition. Even under high shear, viscosity tends to remain stable.

In addition to components A–D listed above, minor amounts (generally less than about 10 wt % total based on the weight of A–D) of conventional additives may be used, including; antifoam agents, antioxidants, dyes, adhesion promoters, slip aids, and other surface tension modifiers.

In a preferred method of preparing the waterborne photoimageable composition of the present invention, those components, such as initiators, antioxidants and dyes, most compatible with a hydrophobic phase are admixed with the monomer fraction to produce a monomer base and those components most compatible with an aqueous phase with the latex polymer, such as antifoam, neutralizer surfactant and associate thickener, are admixed to form a polymer mix. The hydrophobic phase and polymer mix are blended to form a hydrophobic phase-in-water emulsion. Subsequently, high boiling solvents, surfactants, including slip aids, surface tension modifiers, and adhesion promoters are added.

The final water-borne composition is generally between about 20 and about 40 wt. percent solids. In the waterborne composition, the binder comprises between about 10 and about 30 wt %, monomers from about 3 to 20 wt %, initiator from about 0.3 to about 10 wt %, and neutralizing base and/or thickener from about 1.5 to about 20 wt %. Poly(siloxane(s)) are typically used at between about 0.02 and about 1 wt %. If used, a fluoroaliphatic oxyethylene adduct surfactant will typically be present at between about 0.06 and about 2 wt %.

The composition may be coated by any of the coating systems known in the art for coating solvent-borne photoimageable compositions, such as roll coating, dip coating, spray coating or curtain coating.

The compositions of the present invention are applied in a conventional manner, either as liquid compositions directly to a metal clad blank laminate or to a polymeric support sheet to form a dry film. After coating, the composition is dried to remove water and also to remove volatiles, such as ammonia or amine, water, etc., thereby rendering the solution polymer insoluble in acidic or neutral aqueous medium. As the photoimageable composition dries, the system coalesces into a continuous film. Drying is preferably carried out at somewhat elevated temperatures, both to hasten removal of the water, and to drive off the ammonia or volatile amine. Preferably, drying is carried out at a temperature of about 90° C.

In forming a dry film, a water-borne composition is applied to flexible support sheet, e.g., polyethylene terephthalate, and then dried to remove water and volatiles. Subsequently, a protective sheet, e.g., polyethylene, is applied to the photoimageable composition layer, and the dry film is rolled into reels. In drying the photoimageable composition layer, it is found desirable in some cases to leave a residual water content of between about 1 and about 2 wt. % (relative to solids of the photoimageable composition layer). This residual water acts to allow the photoimageable composition layer to conform to surface defects of a substrate, e.g., a copper-clad board, when laminated thereto.

Processing is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the acidic groups of the binder polymers, rendering them soluble and removable. After development, an etchant may be used to remove copper from those areas where the resist was removed, thereby forming a printed circuit. The remaining resist is then removed using an appropriate stripper.

Not only can waterborne primary imaging photoresists be provided in accordance with the invention, but solder mask-forming compositions can be provided as well. By solder mask is meant herein a hard, permanent layer which meets at least the minimal requirements of the abrasion resistance tests as defined in IPC-SM-840B, Table 12, Summary of Criteria for Qualification/Conformance (Institute for Interconnecting circuits). To become hard and permanent, it is generally necessary that the photoimageable composition be curable after exposure, development and processing of the board, e.g., by thermal and/or UV curing. One way to provide a post-cure is to provide binder polymer having free -OH groups in the backbone that may be cured, for example, by cross-linking with aminoplast resins, such as melamine/formaldehyde resins and urea/formaldehyde resins. Alternatively, the photoimageable composition may contain a compatible epoxy resin and a curative for the epoxy resin. It is found that water-borne photoimageable compositions in accordance with the invention exhibit excellent shelf lives after application to copper substrates and can remain on a copper-clad board upwards of several days.

The invention will now be described in greater detail by way of specific examples.

EXAMPLE 1

An aqueous emulsion of a sulfonic acid functional binder polymer is prepared as follows:

I. Preparation of Pre-Emulsified Feed Mix

A. Aqueous Phase Solution A)

A feed mix tank (2 liter Round Bottom resin flask with a bottom port) was sparged with nitrogen gas for about 15 minutes. Then the following were charged with gentle stirring: D.I. Water (200.0 g), Alcolac's "Abex JKB" Anionic Surfactant (As-is: 30% solids - 76.0 g) and more D.I. water (100. g) to quantitatively rinse all the surfactant into the feed mix tank.

B. Pre-neutralization of 2-Sulfoethyl Methacrylate (Solution B)

In an appropriately sized erlenmeyer flask (500 ml.) was charged 2-sulfoethyl methacrylate (153.6 g.) and D.I. water (75.0 g.) to dilute and quantitatively rinse all the monomer into the flask. While stirring with a magnetic stir bar and monitoring with a pH meter, this solution was partially neutralized to a pH ~3.5 by slowly adding 80% dimethyl amino methyl propanol (111.1 g.).

C. Oil Phase (Solution C)

Into an appropriate erlenmeyer flask (2 liter) was weighed methyl methacrylate (367.2 g.), n-Butyl Acrylate (163.2 g.), Aldrich's n-dodecanethiol (2.4013 g.) and styrene (116.0 g.). Upon mixing this solution, it was sparged with nitrogen gas for about 15 minutes.

D. Feed Mix

The feed mix was prepared in an appropriate round bottom flask with a stopcocked drop leg (2 liter). The pre-neutralized aqueous 2-sulfoethyl methacrylate (Solution B) was added to the Aqueous Phase (Solution A). This was rinsed with D.I. water (102.8 g.) to quantitatively transfer this solution. The oil phase (Solution C) was then also added to the Aqueous Phase (Solution A) in the feed mix tank. Stirring was then initiated to yield good mixing without air/nitrogen entrainment (Talboy stirrer at max setting and variac at a setting of 35). This mixture was stirred for at least 20 minutes to yield the pre-emulsified feed mix.

II. Preparation of Initiator Solution

Into an appropriate erlenmeyer flask (50 ml.) was weighed ammonium persulfate (4,000 g.) and D.I. water (20.0 g.). The mixture was stirred to yield a homogeneous solution.

III. Initial Reactor Charge

The reactor (2 liter round bottom 3 neck flask) was sparged with nitrogen gas for about 15 minutes. The D.I. water (218.1 g.) was charged and the reaction mixture was heated to 70° C. using water bath.

IV. Emulsion polymerization

After the initial reactor charge stabilized at 70°–71° C., a portion of the feed mix (100.0 g.) was charged to the reactor. This was followed by a rinse of D.I. water (218.0 g.). With continued stirring, the reactor contents were then heated back to 70° C. Upon re-attaining 70° C., the "Initiator Solution" was charged to the reactor. The reaction was monitored for an exotherm which occured within 5 minutes. The bath temperature was regulated (cooled) to keep the reaction temperature from exceeding 80° C. Ten minutes after adding the initiator solution, the feed mix addition was started using a metering pump. Cooling of the polymerization was continued to bring the temperature back to within 70°–74° C. During the 180 minute feed mix addition period, the reaction temperature stabilized and lined out between 70° and 74° C. Upon completion of the feed mix addition, the feed mix tank and metering pump were rinsed with D.I. water (20.0 g.). This rinse was charged to the reactor. The reactor contents were stirred at 70°–74° C. for one more hour. The resulting dispersion was then heated to 80° to 85° C. and maintained at this temperature for two hours to deplete the remaining residual persulfate. The resulting dispersion polymer was then cooled to 50° C. with a cool water bath, and then to ambient with an ice/water bath.

V. Work-up of Dispersion Polymer

The reaction mixture was then filtered through a 200 mesh fabric filter screen to collect the coagulum. Upon drying, the collected solid was weighed to determine the percent of coagulum formed.

VI. Results for Example 1 Dispersion Copolymer

Final pH: 2.2
As-is % Solids: 42.57% (Theoretical % Solids: 42.58%)
As-is Viscosity: 635 cps
Percent Coagulum: 0.041%

EXAMPLE 2

Waterborne photoimageable compositions were formulated according to Table 1 below. Performance data is according to Table 2 below. "Monomer base" in Table 1 is per Table 3; all materials being mixed together, filtered and subsequently added to the aqueous portion.

TABLE 1

| FORMULATION NAME | INGREDIENT TYPE | #1 | #2 | #3 | #4 | #5 | #6 |
|---|---|---|---|---|---|---|---|
| Sulfonic Acid Binder from Example 1 (100% solids) | Sulfonic Binder | 40.0 | 0.0 | 0.0 | 10.0 | 30.0 | 20.0 |
| Neocryl CL-340 (100% solids) | Carboxylic Binder | 0.0 | 40.0 | 40.0 | 30.0 | 10.0 | 20.0 |

TABLE 1-continued

| FORMULATION NAME | INGREDIENT TYPE | #1 | #2 | #3 | #4 | #5 | #6 |
|---|---|---|---|---|---|---|---|
| DSX-1514 (Henkel) | associative thickener | 4.5 | 4.5 | 4.5 | 4.5 | 4.5 | 4.5 |
| Deionized Water | primary solvent | 50.0 | 50.0 | 150.0 | 50.0 | 50.0 | 50.0 |
| BYK-033 (BYK/Chemie) | antifoam | 1.0 | 1.0 | 1.0 | 1.0 | 1.0 | 1.0 |
| Monomer Base | see Table #3 | 20.5 | 20.5 | 20.5 | 20.5 | 20.5 | 20.5 |
| Q4-3667 (Dow Corning) | slip aid | 0.45 | 0.45 | 0.45 | 0.45 | 0.45 | 0.45 |
| Fluorad FC170-C (3M) | surface tension modifier | 1.0 | 1.0 | 1.0 | 1.0 | 1.0 | 1.0 |
| Texanol (Eastman) | coalescing solvent | 4.5 | 4.5 | 4.5 | 4.5 | 4.5 | 4.5 |

NOTE:
Ingredient weights listed in grams.
Neocryl CL-340 is a styrene/acrylic polymer having an acid number of about 160. Q4-3667 (Dow) is an 80:20 mixture of polyether modified dimethylsiloxanes and cyclodimethylsiloxanes.

TABLE 2

| FORMULATION NAME | #1 | #2 | #3 | #4 | #5 | #6 |
|---|---|---|---|---|---|---|
| PERFORMANCE RESULTS | | | | | | |
| Viscosity (initial) | 1050 cps | 11500 cps | 2000 cps | 8700 cps | 1500 cps | 2900 cps |
| Percent Solids | 60% | 60% | 30% | 60% | 60% | 60% |
| Drying Time for Tack Free Surface | 25 Min. | 25 min. | 45 min. | 25 min. | 25 min. | 25 min. |
| Alkaline Resistance | good | fair | fair | fair to good | good | good |
| Coating Defects | 0 voids/ft2 | 10 voifd/ft 2 | 0 voids/ft 2 | 7 voids/ft2 | 0 voids/ft2 | 2 voids/ft2 |
| Coating Uniformity | no ribbing | severe ribbing | no ribbing | moderate ribbing | no ribbing | slight ribbing |
| Developing Time | 32 sec. | 22 sec. | 22 sec. | 25 sec. | 31 sec. | 28 sec. |

NOTE:
See Table #4 for circuit board processing conditions.
NOTE:
n.a. is recorded when bad performance prohibited further processing.

TABLE 3

| MONOMER BASE COMPONENTS | COMPONENT TYPE | GRAMS PER FORMULA |
|---|---|---|
| Ethoxylated TMPTA (3 moles ethoxylation) | multi functional acrylate | 17.6 |
| Modaflow | flow additive | 0.05 |
| Antioxidant 2246 | antioxidant | 0.03 |
| Quantacure ITX (thioxanthone) | photosensitizer | 0.59 |
| Quantacure EPD (3° amine) | photoinitiator | 1.49 |
| Baso Blue 688 | background dye | 0.09 |
| Triphenyphosphine | antioxidant | 0.5 |
| Benzotriazole | adhesion promoter | 0.25 |

TMPTA = trimethylol propane triacrylate
PROCESSING CONDITIONS
Coating - Burkle (single sided) Roller Coater, 22 threads per inch
Substrate - Copper Clad
Exposure - HMW ORC, model 301 B, diazo art work
Development - 1% sodium carbonate monohydrate, 85° F., 2x breakpoint
Etching - 3 normal cupric chloride, 140° F., 1.3 × minimum etch
Stripping - 3% sodium hydroxide, 130° F.

PERFORMANCE EXPLANATION
Percent Solids - Percent of coating which is non-volatile
Viscosity - measured on a Brookfield viscometer initially and after one week at 70° F.
Alkaline Resistance - the resistance was measured after alkaline etch at pH 9.2
Coating Defects - the number of coating voids (thin spots) were counted after roller coating
Coating Uniformity - the uniformity was observed immediately after coating
Developing Time - twice the amount of time required to remove the unexposed resist
Drying Time for Tack Free - amount of drying time at 80° C. required to create a coating with a tack free surface.

What is claimed is:

1. A photoimageable composition that can be borne in water comprising
   A) between about 30 and about 80 wt % of a latex binder polymer having acid functionality, at least about 50 mole percent of which is sulfonic acid functionality, the acid functionality providing, in total, an acid number of between about 40 and about 250,
   B) between about 15 and about 50 wt % of alpha,-beta-ethylenically unsaturated monomer(s),
   C) between about 0.1 and about 25 wt % of a photo-initiator or photoinitiator chemical system which generates free radicals, and
   D) between about 1 and about 40 wt % of a neutralizing base and/or polyether polyurethane associate thickener in amounts sufficient to stabilize the photoimageable composition as an aqueous emulsion, the weight percentages being based on total weight of components A-D.

2. The photoimageable composition of claim 1 dispersed in an aqueous medium.

3. A dry film comprising a polymeric support sheet and a layer of the photoimageable composition of claim 1 thereon.

* * * * *